United States Patent
Grover et al.

(10) Patent No.: US 6,825,105 B2
(45) Date of Patent: Nov. 30, 2004

(54) MANUFACTURE OF SEMICONDUCTOR DEVICES WITH SCHOTTKY BARRIERS

(75) Inventors: Raymond J. Grover, Manchester (GB); Steven T. Peake, Warrington (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 140 days.

(21) Appl. No.: 10/199,000

(22) Filed: Jul. 19, 2002

(65) Prior Publication Data

US 2003/0022474 A1 Jan. 30, 2003

(30) Foreign Application Priority Data

Jul. 24, 2001 (GB) .............................. 0118000

(51) Int. Cl.⁷ .............................................. H01L 21/28
(52) U.S. Cl. ................... 438/570; 438/573; 438/576; 438/578; 257/471; 257/473
(58) Field of Search .................. 438/92, 573, 576, 438/578; 257/409, 471, 473; 751/173

(56) References Cited

U.S. PATENT DOCUMENTS

| | | | |
|---|---|---|---|
| 4,521,795 A | 6/1985 | Coe et al. ................... 357/23.4 |
| 4,646,115 A | 2/1987 | Shannon et al. ............... 357/15 |
| 5,225,359 A * | 7/1993 | DeLong ........................ 437/39 |
| 5,612,567 A | 3/1997 | Baliga ........................ 257/475 |
| 6,087,224 A | 7/2000 | Luo ............................ 438/270 |
| 6,399,413 B1 * | 6/2002 | Krutsick ....................... 438/92 |

FOREIGN PATENT DOCUMENTS

DE 19801999 A 12/1998 ......... H01L/29/872

* cited by examiner

Primary Examiner—David Nelms
Assistant Examiner—Renee R Berry
(74) Attorney, Agent, or Firm—Aaron Waxler

(57) ABSTRACT

In the manufacture of trench-gate power MOSFETs, trenched Schottky rectifiers and other devices including a Schottky barrier, a guard region (15s), trenched insulated electrode (11s) and the Schottky barrier (80) are self-aligned with respect to each other by providing spacers (52) to form a narrow window (52a) at a wider window (51a) in a mask pattern (51, 51s) that masks where the Schottky barrier (80) is to be formed. The trenched insulated electrode (11s) is formed by etching a trench (20) at the narrow window (52a) and by providing insulating material (17) and then electrode material (11s) in the trench. The guard region (15s) is provided by introducing dopant (61) via the wider window (51a). The mask pattern (51, 51s) masks the underlying body portion against this dopant introduction and is sufficiently wide (y8) to prevent the dopant (61) from extending laterally into the area where the Schottky barrier (80) is to be formed. Then at least the mask pattern (51, 51s) is removed before depositing a Schottky electrode (33).

15 Claims, 7 Drawing Sheets

MANUFACTURE OF SEMICONDUCTOR DEVICES WITH SCHOTTKY BARRIERS

This invention relates to methods of manufacturing semiconductor devices having a Schottky barrier between a Schottky electrode and a semiconductor body portion that is bounded laterally by a trenched insulated electrode. The invention also relates to such devices constructed in accordance with such manufacturing methods. The devices may be, for example trench-gate power MOSFETs (insulated-gate field-effect transistors), and/or, for example trenched Schottky rectifier diodes.

It is known from U.S. Pat. No. 4,521,795 (our ref: PHB32842) to integrate a Schottky barrier diode between the source and drain of a power MOSFET, i.e. in parallel with the p-n junction diode between the drain drift region and the channel-accommodating region of the MOSFET. The Schottky barrier is formed between part of the source electrode and a semiconductor body portion that forms part of the drain drift region. Such a parallel Schottky diode can serve to increase switching speed and reduce high dissipation, stored charge, and high switching losses that could otherwise result from conduction of the p-n junction diode when, for example, the MOSFET is switching inductive loads and/or serves as the control FET of a synchronous dc—dc converter. Thus, the Schottky diode has lower Vf than the p-n diode and should therefore take the current that would otherwise flow through the p-n diode. The whole contents of U.S. Pat. No. 4,521,795 are hereby incorporated herein as reference material.

U.S. Pat. No. 4,521,795 discloses embodiments in which the Schottky barrier terminates laterally in a guard ring formed by a part of the channel-accommodating region of the MOSFET. In addition to MOSFET embodiments of the planar DMOS type, U.S. Pat. No. 4,521,795 teaches the inclusion of such a Schottky barrier in a trench-gate MOSFET. In this latter case, the MOSFET trench-gate is an insulated electrode in a trench that laterally bounds a portion of the drift region that forms the Schottky barrier with the source electrode.

U.S. Pat. No. 4,646,115 (our ref: PHB33047) and U.S. Pat. No. 5,612,567 disclose discrete Schottky barrier rectifiers of advantageous construction. The Schottky barrier areas of these rectifiers are present between closely-spaced field relief means in the form of, inter alia, trenched insulated electrodes. The Schottky electrode forms the barrier areas with surface portions of a semiconductor drift region that are laterally bounded by the trenched electrodes. These trenched electrodes are electrically contacted by the Schottky electrode. The drift region may adjoin the trench over most of the depth of the trench and has a width and doping concentration sufficient for the drift region to be depleted in a blocking state of the Schottky-rectifier device. The whole contents of U.S. Pat. No. 4,646,115 and U.S. Pat. No. 5,612,567 are hereby incorporated herein as reference material.

Nowadays, in the manufacture of semiconductor devices, it is often desirable to use self-aligned techniques to fabricate the devices with compact geometries.

According to the present invention, there are provided methods of manufacturing such devices, wherein:

(a) a mask pattern is provided at a surface of a semiconductor body to mask an area where a Schottky barrier is to be formed, (b) a narrow window is defined by providing sidewall extensions at the sidewalls of a wider window of the mask pattern, and a trenched insulated electrode is formed by etching a trench into the body at the narrow window and by providing insulating material and then electrode material in the trench, (c) a guard region is provided by introducing dopant of the second conductivity type into the body via the wider window of the mask pattern, the mask pattern being sufficiently thick to mask the underlying body portion against the dopant introduction and sufficiently wide to prevent the dopant from extending laterally into the area where the Schottky barrier is to be formed, and (d) at least the mask pattern is removed before depositing a Schottky electrode at least at the area where the Schottky barrier is to be formed.

Thus, the present invention uses these process steps (a), (b), (c) and (d) to self-align the guard region, the trenched insulated electrode and the Schottky barrier with respect to each other. By so using the wider and narrow windows as defined by the sidewall extensions, both a very narrow guard region and a very narrow insulated-electrode trench can be formed in a precise and self-aligned manner with respect to the Schottky barrier area. Furthermore, these process steps (a), (b), (c) and (d) may be used in various device contexts in a manner compatible with various device technologies to manufacture, for example, discrete Schottky rectifiers, discrete MOSFETs with integrated Schottkies, and integrated circuit devices.

One or more of the process steps (a), (b), (c) and (d) may also be used to provide other parts of the semiconductor device, so streamlining the manufacture. Thus, of particular benefit is the synergy possible between a method in accordance with the present invention and the advantageous method of manufacturing trench-gate MOSFETs disclosed in U.S. Pat. No. 6,087,224 (our reference PHB34245). In the method of U.S. Pat. No. 6,087,224:

(i) a narrow window is defined by providing sidewall extensions at the sidewalls of a wider window in a first mask at a surface of a semiconductor body, (ii) a trench is etched at the narrow window into a body portion of the first conductivity type that provides a drain drift region of the device, (iii) the trench-gate is provided as an insulated electrode in the trench, and (iv) a source region of the first conductivity type is provided so as to be self-aligned with the trench-gate by means of the sidewall extensions.

The whole contents of U.S. Pat. No. 6,087,224 are hereby incorporated herein as reference material.

The sidewall extensions of step (i) may be formed in step (b). The guard region of the present invention may be formed simultaneously with at least a part of a channel-accommodating region of the U.S. Pat. No. 6,087,224 device, both regions being of the second conductivity type. A part of the source electrode (that contacts the source region) may comprise the Schottky electrode that contacts a surface-adjacent part of the drain drift region. The process steps (a), (b), (c) and (d) of the present invention may be combined into various forms of the U.S. Pat. No. 6,087,224 method. Thus, for example, the source region and/or channel-accommodating region (and hence the guard region) may be provided either before or after forming the trench-gate, either a deep or shallow highly-doped region may be provided (also in a self-aligned manner) in the channel-accommodating region (but masked from the Schottky barrier area), either a doped-semiconductor or a metal or silicide material may be used for the gate, and either a deposited or grown insulating overlayer may be provided (also in a self-aligned manner) over the trench-gate.

The MOSFET may be a cellular device that comprises at least one Schottky cell in Which the Schottky barrier is formed with the drain drift region, and a plurality of transistor cells without the Schottky barrier. This permits the transistor cells to be kept very compact. Thus, the mask pattern of step (a) may be narrower over the transistor cells than over the area where the Schottky barrier is formed. The dopant introduced into the transistor cells in step (c) may be laterally scattered and/or diffused to merge into a single channel-accommodating region that extends under the mask pattern in the transistor cells. Additional dopant of the second conductivity type may be introduced into the transistor cells to form a more highly doped contact region for the channel-accommodating region of the transistor cells. This additional dopant is easily masked from the at least one Schottky cell where the drain drift region extends to the body surface to form the Schottky barrier. The mask for the Schottky cell does not require critical alignment.

Synergy is also possible between a method in accordance with the present invention and the advantageous construction of a cellular Schottky-rectifier device as disclosed in U.S. Pat. No. 4,646,115 and U.S. Pat. No. 5,612,567. In this case, the present invention permits the inclusion of a very compact guard ring of the second conductivity type in a self-aligned manner, at the body surface, adjacent to the trenched insulated electrode. As taught in U.S. Pat. No. 4,646,115 and U.S. Pat. No. 5,612,567, the trenched insulated electrode can be electrically contacted by the Schottky electrode, and the semiconductor drift region that adjoins the trench over most of the depth of the trench advantageously has a width and doping concentration sufficient for the drift region to be depleted in a blocking state of the Schottky-rectifier device. Such a Schottky rectifier constructed in accordance with the present invention can have a low leakage current as well as a high breakdown voltage and improved Vf.

Advantageous features in accordance with the present invention are set out in the appended Claims. These and other particular features in accordance with the present invention are illustrated in embodiments of the invention that are now described, by way of example, with reference to the accompanying drawings, in which:

Figure 1:
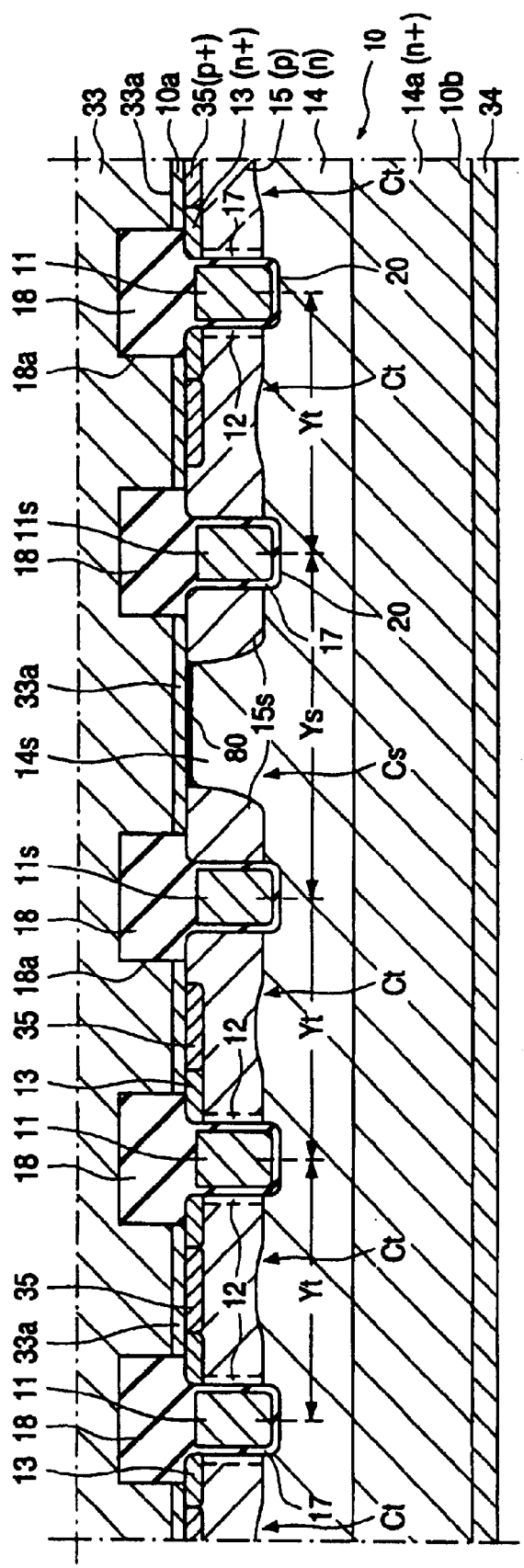
FIG. 1 is a cross-sectional view of an active central part of one example of a trench-gate MOSFET device manufactured in accordance with the invention.

It should be noted that all the Figures are diagrammatic, with the relative dimensions and proportions of various parts of their drawings being shown exaggerated or reduced in size, for the sake of clarity and convenience in the drawings. The same reference signs are generally used to refer to corresponding or similar features in modified and different embodiments.

The devices manufactured in all these embodiments (whether MOSFET or Schottky rectifier) have a Schottky barrier 80 between a Schottky electrode 33 and a semiconductor body portion 14s of a first conductivity type, in one or more cells Cs that are bounded laterally by a trenched insulated electrode 11s. The Schottky barrier 80 terminates laterally in a guard region 15s of the opposite, second conductivity type adjacent to the trenched insulated electrode 11s. In their manufacture, the following process steps are used to self-align the guard region 15s, the trenched insulated electrode 11s and the Schottky barrier 80 with respect to each other:

(a) a mask pattern 51 is provided at a surface 10a of a semiconductor body 100 to mask an area where the Schottky barrier 80 is to be formed, (b) a narrow window 52a is defined by providing sidewall extensions 52 (commonly termed "spacers") at the sidewalls of a wider window 51a of the mask pattern 51, and the trenched insulated electrode 11s is formed by etching a trench 20 into the body 100 at the narrow window 52a and by providing insulating material 17 and then electrode material 11' in the trench 20, (c) the guard region 15s is provided by introducing dopant 61 of the second conductivity type into the body 100 via the wider window 51a, the mask pattern 51 being sufficiently thick to mask the underlying body portion against the dopant introduction and sufficiently wide y8 to prevent the dopant from extending laterally into the area where the Schottky barrier 80 is to be formed, and (d) at least the mask pattern 51 is then removed before depositing the Schottky electrode 33 at least at the area where the Schottky barrier 80 is to be formed.

Figure 2:
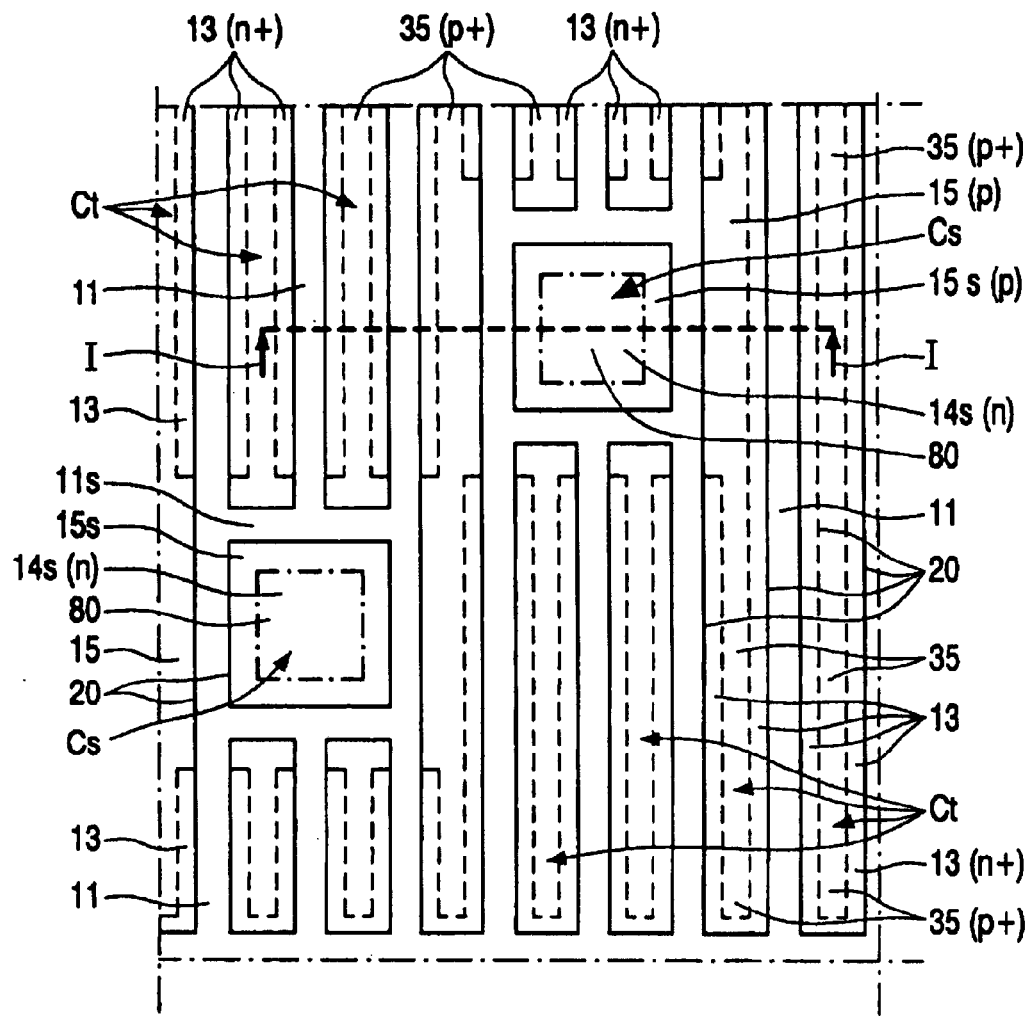
FIG. 2 is a plan view of one example of the cellular layout of a selection of parts of the FIG. 1 device, showing both transistor cells and Schottky cells.

Trench-Gate MOSFET First Example of Device (FIGS. 1 & 2)

FIG. 1 illustrates a first example of a trench-gate cellular power MOSFET device with integrated Schottky diode, manufactured using these process steps (a), (b), (c), and (d). The device comprises a plurality of transistor cells Ct without the Schottky barrier 80, and at least one Schottky cell Cs in which the Schottky barrier 80 is formed with portion 14s of the MOSFET drain region 14. The drain region 14 is common to all cells Ct and Cs.

In the transistor cells Ct, a channel-accommodating region 15 of a second conductivity type (i.e. p-type in this example) separates source and drain regions 13 and 14, respectively, of the first conductivity type (n-type in this example). The insulated trench-gate 11 of the MOSFET is present in a trench 20 that extends through the regions 13 and 15 into an underlying portion of the drain region 14. The gate 11 is capacitively coupled to the channel-accommodating region 15 by an intermediate dielectric layer 17 at the walls of the trench 20. The application of a voltage signal to the gate 11 in the on-state of the device serves in known manner for inducing a conduction channel 12 in the region 15 and for controlling current flow in this conduction channel 12 between the source and drain regions 13 and 14. The source region 13 is located adjacent to the top major surface 10a of the device body 10, where regions 13 and 15 are ohmically contacted by the electrode 33. Thus, the electrode 33 provides the source electrode of the MOSFET device. The MOSFET trench-gate 11 is insulated from the overlying electrode 33 by an intermediate insulating overlayer 18.

In the Schottky cell(s) Cs, a part of the source electrode 33 forms the Schottky barrier 80 with portion 14s of the drain region. As described below, the trenched insulated electrode 11s can be formed in the same process steps as the trench-gate 11 of the MOSFET cells Ct. The guard region 15s can be formed in the same process steps as the channel-accommodating region 15 of the MOSFET cells Ct. However, as illustrated in FIG. 1, the pitch (cell width as measured between the centres of its boundary trenches 20) is wider for the Schottky cells Cs (pitch Ys) than for the transistor cells Ct (pitch Yt).

FIG. 1 shows a vertical power device structure. The region 14 is a drain-drift region, which may be formed by an epitaxial layer of high resistivity on a more highly-doped substrate 14a of the same conductivity type. This substrate 14a is contacted at the bottom major surface 10b of the device body 10 by a drain electrode 34.

Typically, the device body 10 is formed from a wafer body 100 of monocrystalline silicon. The dielectric layer 17 is typically of thermally grown silicon dioxide or deposited silicon dioxide. Typically, the gate 11 and electrode 11s are of conductively-doped polycrystalline silicon. The source electrode 33 is typically of aluminium or an aluminium silicide alloy. Advantageously, the source electrode 33 has a lower layer 33a of metal silicide. Such a layer 33a can form a silicide Schottky barrier 80 with the drain drift region portion 14s and a silicide low-ohmic contact to the source region 13. Thus, a reduction in source contact resistance is also possible in this case.

FIG. 2 illustrates an example of one specific layout embodiment for the cells Ct and Cs of FIG. 1. The cross-section of FIG. 1 may be taken on the line I—I of FIG. 2. In this particular example, the pitch Ys of the Schottky cells Cs is twice the pitch Yt of the transistor cells Ct. In this particular example, the transistor cells Ct have an elongate stripe geometry, whereas the Schottky cells Cs are shown with a square geometry. Instead of being square, the Schottky cells Cs may be rectangular or stripe-shaped so as to have a larger area with the same pitch Ys. For the sake of compactness in the drawing, FIG. 2 shows only one transistor stripe cell Ct between two Schottky cells Cs. However, the layout may instead comprise groups of elongate stripe-shaped transistors cells Ct (of individual width Yt) between Schottky cells Cs (of individual width Ys). Thus, for example, elongate stripe-shaped Schottky cells Cs may alternate with the groups of elongate stripe-shaped transistors cells Ct. Furthermore, it will be understood that quite different, known cell geometries and cellular layouts may be used with the present invention. Thus, for example the cells Cs and Ct may have square and/or rectangular and/or close-packed hexagonal and/or stripe geometries, and/or mixtures thereof. In each case, the trench 20 (with its gate 11 and/or electrode 11s) extends around the boundary of each cell.

The characteristics of the integrated Schottky diode can be adjusted by varying the Schottky barrier height, but also by varying its cellular layout, for example, the number of Schottky cells Cs, their cell geometry and their width. Although the Schottky pitch Ys is wider than the transistor pitch Yt, it is preferably still sufficiently narrow that the drain region portion 14s of the Schottky cell Cs can be fully depleted in a blocking state of the Schottky diode, i.e. before breakdown. Thus, field-relief for the Schottky barrier 80 can be provided by the guard regions 15s and/or by the insulated trench electrode 11s in a manner similar to that described in, for example, U.S. Pat. No. 4,521,795. This allows several advantages to be achieved. Thus, the doping n of the region 14 can be made higher than otherwise, so reducing the Schottky Vf. The Schottky-barrier leakage current, can be reduced, or the barrier height for the same leakage can be lowered, so gaining an advantage in Vf.

For simplicity and clarity in the drawing, FIG. 2 shows only a few device parts, namely the surface terminations of the trench 20 (in solid outline), the source region 13 (in broken outline), and the Schottky barrier 80 and its guard region 15s (in chain-dot outline). FIGS. 1 and 2 show only a few cells Ct and Cs, but typically the MOSFET device comprises many thousands of these parallel transistor cells Ct between the electrodes 33 and 34.

The active cellular area of the device may be bounded around the periphery of the device body 10 by various known peripheral termination schemes (also not shown). Such schemes normally include the formation of a thick field-oxide layer in the peripheral device area at the body surface 10a, before the transistor cell fabrication steps. Furthermore, various known circuits (such as gate-control circuits) may be integrated with the device in an area of the body 10, between the active cellular area and the peripheral termination scheme. Typically their circuit elements may be fabricated with their own layout in this circuit area using some of the same masking and doping steps as are used for the transistor cells Ct.

First Embodiment: Trench-Gate MOSFET Process (FIGS. 3 to 11)

Successive stages in the fabrication of the cells Ct and Cs will now be described with reference to the process sequence of FIGS. 3 to 11, by way of example of a specific embodiment. This process sequence forms spacers 52 that are used in the fabrication of the Schottky cells Cs in accordance with the present invention, and which are also used in accordance with the invention disclosed in U.S. Pat. No. 6,087,224, for forming the MOSFET structure in the transistor cells Ct. Thus, the device structure in both cells Cs and Ct is formed with a compact geometry in a self-aligned manner. Indeed, apart from the two extra non-critical alignment steps illustrated in FIGS. 8 and 9, a single masking pattern 45,51 (which is photo-lithographically defined in FIG. 3) can be used for determining all subsequent windows (for etching, planarisation, doping, contacting, etc.) in the transistor and Schottky cell areas shown in FIGS. 1 to 11. This self-alignment simplifies the manufacture and permits a reproducible close spacing of the transistor cells Ct, for example, with a cell pitch Yt of about 1 micrometer or less, compatible with the integration of one or more Schottky cells Cs within the cellular area.

Figure 3:
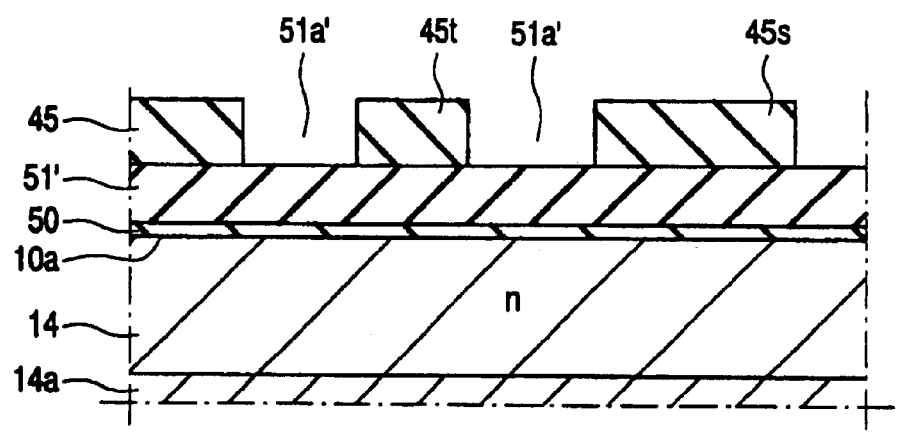
FIGS. 3 to 11 are cross-sectional views of a transistor-cell part and a Schottky-cell part of the FIG. 1 device at successive stages in its manufacture by one example of a method in accordance with the invention.
Figure 5:
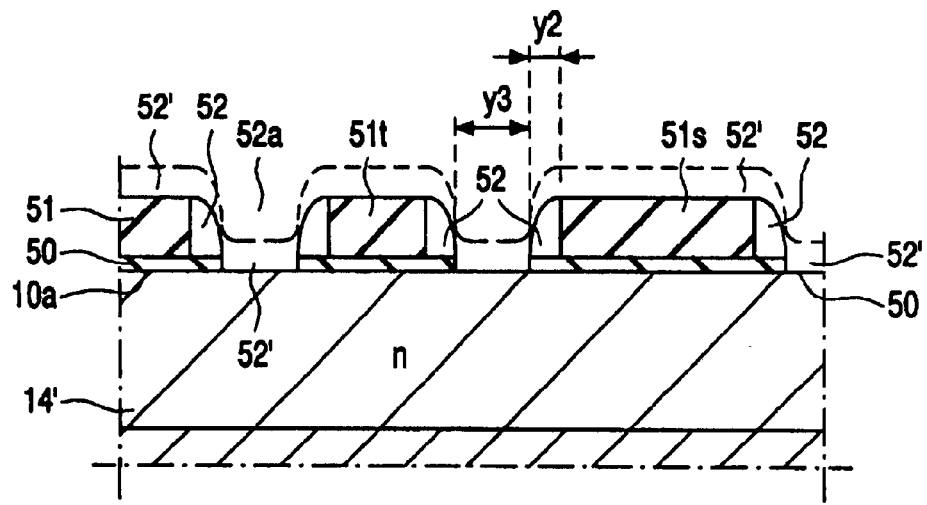
Figure 7:
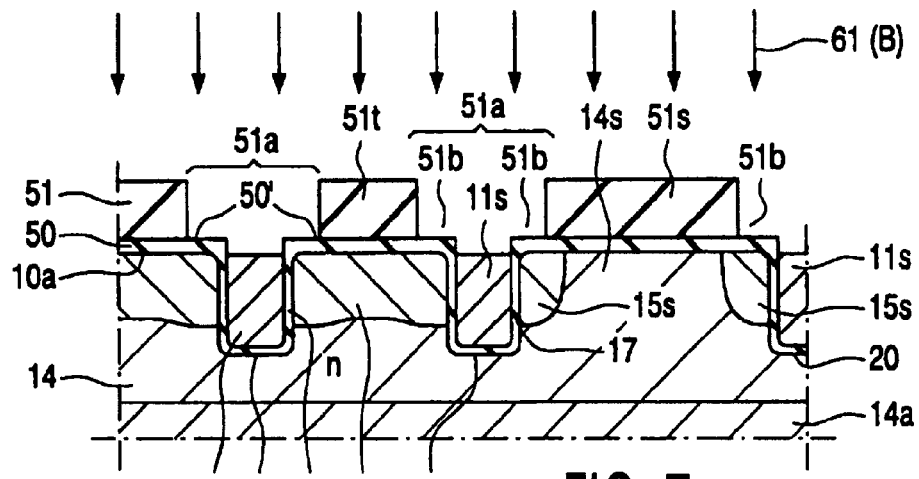
Figure 8:
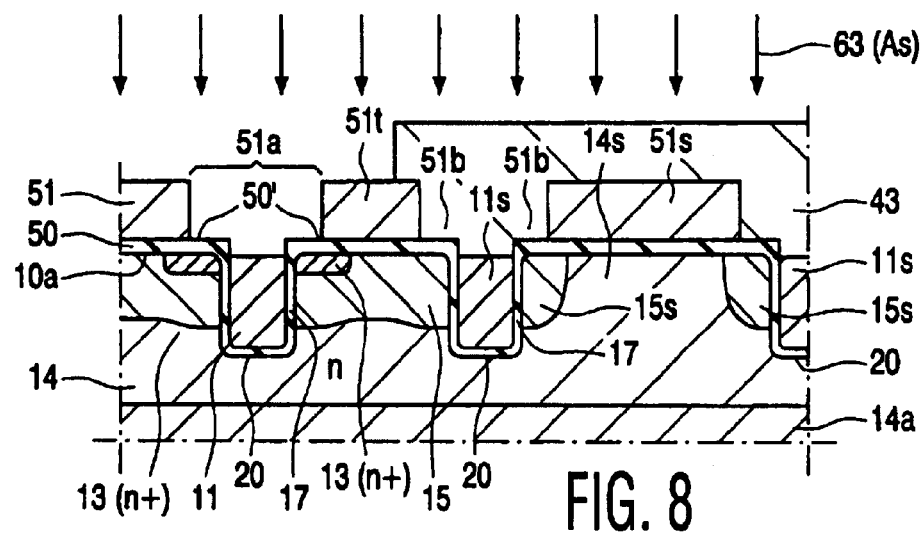

FIG. 3 illustrates the body part of a transistor cell Ct and a Schottky cell Cs of FIG. 1 at an early stage in the device manufacture. A thick silicon nitride layer 51' is deposited on a thin silicon dioxide layer 50 on the silicon body surface 10a. Typically the oxide layer 50 may be about 50 nm thick. The thickness of the nitride layer 51' is chosen in accordance with:

- the desired depth & width proportions of the window 51a for formation of the spacers 52 in FIG. 5,
- its ability to mask against penetration by dopant ions 61 in the implant stage of FIG. 7, as well as masking the lower energy ions 63 of the FIG. 8 implant.

In a particular device embodiment, by way of a specific example, the thickness of the nitride layer 51' may be about 0.5 $\mu$m or more, and window 51a may be about 0.5 $\mu$m wide.

Figure 4:
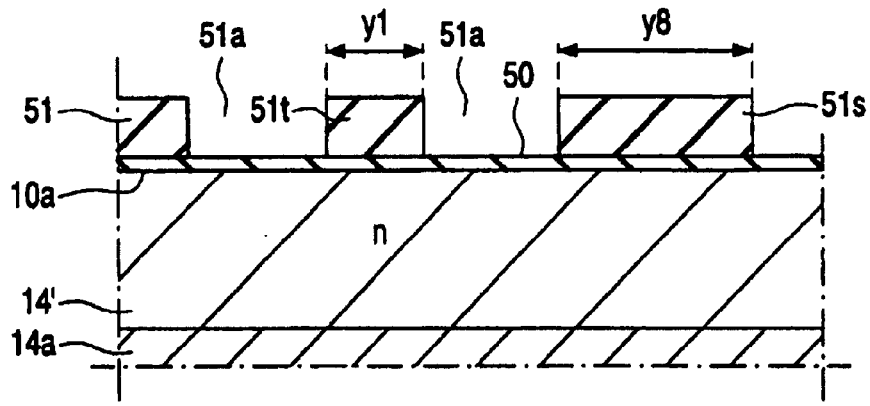

The cell pitch and the layout geometry of the device (for example as in FIG. 2) is determined by the photolithographic and etching stage illustrated in FIGS. 3 and 4. The window 51a is defined using known photolithographic techniques. Thus, a photoresist mask 45 with a corresponding window 51a' is provided on the nitride layer 51' as illustrated in FIG. 3. This serves as an etchant mask for etching the window 51a into the layer 51' to form the mask pattern 51 illustrated in FIG. 4. This mask pattern 51 and its associated windows (51a of FIG. 4 and narrowed window 52a of FIG. 5) have a layout geometry that defines the layout of the device cells Ct and Cs and their pitch Yt and Ys. Thus, the windows 51a & 52a define the trench boundary of the cells Ct and Cs.

The mask pattern 51 is narrower over the transistor cell areas than it is over the area where the Schottky barrier 80 is formed. Thus, the mask parts 51t and 51s are of different respective widths y1 and y8 between neighbouring windows 51a, in accordance with the desired different pitches Yt and Ys for the cells Ct and Cs, whatever cellular layout geometry is chosen. Width y1 of mask part 51t is sufficiently small to allow the dopant 61 introduced via the doping windows 51b in step (c) to merge laterally together to form the region 15 of the transistor cell Ct (FIG. 7). Width y8 of mask part 51s is sufficiently large as to prevent the dopant 61 introduced via the doping windows 51b from merging together in the Schottky cells Cs.

An oxide layer 52' is now contour deposited on the top and sidewalls of the nitride mask 51 and at the bottom of the window 51a. This oxide layer 52' is then etched back in known manner, using a directional etch, to remove it from the top of the nitride mask 51 and from the bottom of the window 51a, while leaving the spacers 52 at the sidewalls. The etch-back also removes the exposed thin oxide layer 50 from the window 52a. Typically, the contour-deposited oxide layer 52' may be about 0.2 µm, so that the remaining width y2 of spacers 52 is in the range of 0.1 µm to 0.2 µm. FIG. 5 shows the resulting structure, with the narrower window 52a of width y3 as defined by the spacers 52 of width y2.

The trench 20 is now etched into the body 100 at the window 52a. As shown in FIGS. 3 to 6, the silicon body portion 14' into which the trench 20 is etched may have a doping concentration of the same conductivity type (n-type, in this example) from the surface 10a into an area providing a part of the drain region 14. This doping concentration n may be substantially homogeneous, for example, about $2 \times 10^{16}$ or $3 \times 10^{16}$ phosphorus or arsenic atoms cm$^{-3}$. Alternatively, it may be graded from less than $5 \times 10^{16}$ (e.g. $1 \times 10^{16}$) phosphorus or arsenic atoms cm$^{-3}$ at the surface 10a to more than 10 times greater (e.g. $3 \times 10^{17}$ phosphorus or arsenic atoms cm$^{-3}$) at the interface with substrate 14a, as disclosed in U.S. Pat. No. 5,612,567. In a specific embodiment, the depth to which the trench 20 is etched may be, for example, about 1.5 µm. This is three times the thickness of the mask 51 and so illustrates the extent to which the drawing proportions are distorted for convenience in these diagrammatic Figures.

The dielectric layer 17 is then formed at the walls of the trench 20, for example by thermal oxidation of the silicon body portion 14' or by deposition. Thereafter, electrode material 11' is deposited to a thickness that is sufficient to fill the trench 20 and to extend above the window 52a and over the mask 51,52, and is then etched back to leave it forming the electrode 11, 11s. Typically, the electrode 11, 11s comprises doped polycrystalline silicon or other semiconductor material. Its doping concentration may be provided while the material 11' is being deposited or after deposition, for example at the etch-back stage illustrated in FIG. 6. In this embodiment, this doping concentration of the electrode 11, 11s is of the first conductivity type (n-type in this example). It is of greater magnitude than the doping concentration of the second conductivity type introduced in the FIG. 7 step (c) for the channel-accommodating region 15 and the guard region 15s.

The oxide spacers 52 are now etched away to re-open the window 51a and so to form a doping window 51b between the mask pattern 51 and the trenched insulated electrode 11, 11s. This etch also removes the thin oxide 50 under the oxide spacers 52. As the window 51b is to be used for implantation, a thin oxide 50' is now regrown in this window 51a on the exposed area of the silicon body surface 10a (and also grows on the exposed silicon electrode 11 and 11s). The resulting structure is shown in FIG. 7.

The dopant-ion implant illustrated in FIG. 7 is now carried out, for example with a high dose of boron ions 61. Typically, the ion dose is at least about $2 \times 10^{13}$ boron ions cm$^{-2}$, implanted at an energy in the range of about 100 keV to 200 keV. At this high dose and energy, the dopant ions 61 implanted at the window 51b are scattered laterally up to about 0.4 µm below the mask pattern 51. A heating step, for example 1,100° C. for 40 minutes, is then carried out in order to anneal the implantation damage and activate the dopant to form the p-type regions 15 and 15s. Some thermal diffusion of the implanted dopant occurs during this heating step. Thus, as a result of both ion scattering and dopant diffusion, the p-type regions 15 and 15s extend laterally under the masking pattern 51.

The width y8 of mask part 51s is chosen sufficiently large as to prevent this scattering and diffusion of the dopant 61 introduced via the adjacent doping windows 51b from merging together under the mask part 51s, see FIG. 7. Thus, drain-region portion 14s still extends to the body surface 10a where the Schottky barrier 80 is to be formed, inside the area bounded by the guard region 15s. Although this paragraph speaks of "the adjacent windows 51b", this should be understood in the context of the cross-sectional view of FIG. 7. In reality, the cellular layout (as determined by the masking pattern 51) is such that there is a single annular window 51b adjacent to the mask part 51s. The resulting guard region 15s extends around the entire perimeter of the surface area where the Schottky barrier 80 is to be formed in the Schottky cell Cs. The drain-region portion 14s extends to the body surface 10a through the central aperture of this single annular guard region 15s.

The width y1 of the mask part 51t is sufficiently narrow that a merged region 15 is formed thereunder, by the scattering and diffusion of the dopant 61 introduced via the adjacent doping windows 51b, see FIG. 7. This merged region 15 separates the drain drift region 14 from the body surface 10a in each transistor cell Ct. Thus, in this specific embodiment, each transistor cell Ct comprises a single channel-accommodating region 15. However, a modification is possible in accordance with the invention in devices where a narrower width is desired for the guard region 15s. In this modification, the channel-accommodating regions 15 formed by the doping step of FIG. 7 may not wholly merge together under the mask part 51t. Instead, the drain drift region 14 may be separated from the body surface 10a at the centre of the cell Ct by the highly doped contact region 35 provided in each transistor cell Ct the FIG. 9 doping step.

Although the trench electrodes 11 and 11s are not masked against the FIG. 7 implantation, the boron ion dose is insufficient to over-dope the n-type doping concentration of the polycrystalline silicon electrode material.

The doping concentration n+ of the source region 13 is now introduced into the body 100 via the doping window 51b. The nitride layer 51 acts as a mask. As illustrated in FIG. 8, this source doping is preferably carried out by implantation of arsenic ions 63. Typically, a very high dose is used to provide a doping concentration of $10^{20}$ to $10^{22}$ arsenic atoms $cm^{-3}$. The ion energy is typically about 30 keV. At this dose and energy, the arsenic ions are scattered below the edge of the mask 51. After one or more short anneals, for example 900° C. for 1 hour during the subsequent stages (FIGS. 9 and 10), the source region typically extends laterally about 0.1 μm to 0.2 μm beyond the window edge line of the mask part 51t.

The source regions 13 are not needed in the Schottky cells Cs, and their presence may degrade the Schottky barrier characteristics by introducing a parasitic bipolar transistor (13, 15s, 14s). Thus, as illustrated in FIG. 8, a mask 43 is preferably provided over the Schottky cells Cs to mask them against the source implant 63. This mask 43 may be of, for example, photoresist. Preferably the device is made with inactive intermediate cell parts between the Schottky cell Cs and the surrounding transistor cells Ct. Such a situation is illustrated in FIGS. 1, 2 and 8. In this case, the alignment of the mask 43 with respect to the very narrow trench 20 of the insulated electrode 11s of the Schottky cell Cs is not critical.

Figure 9:
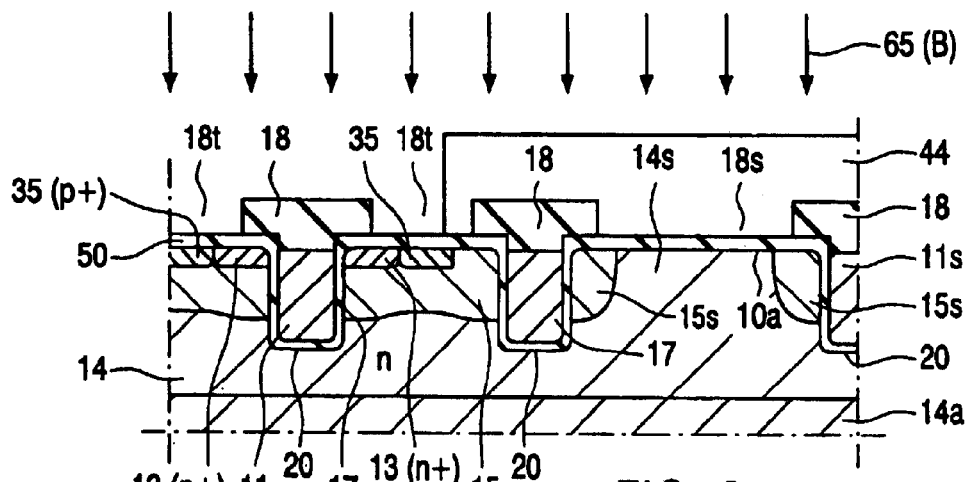
Figure 10:
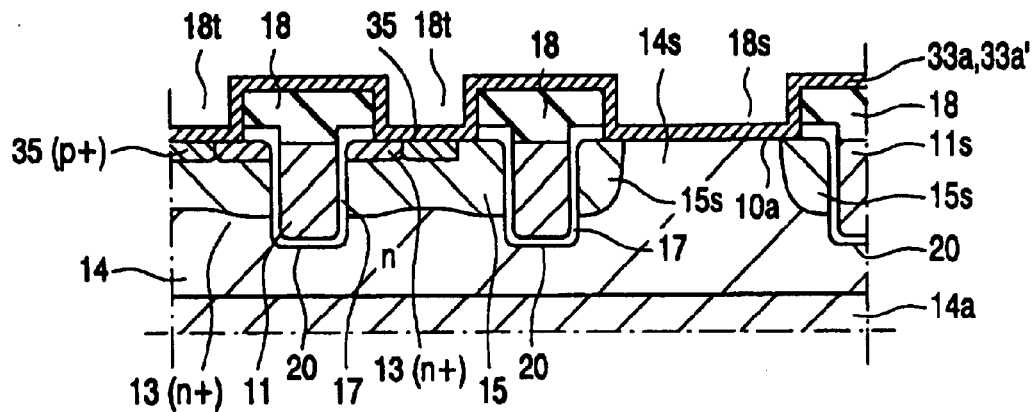
Figure 11:
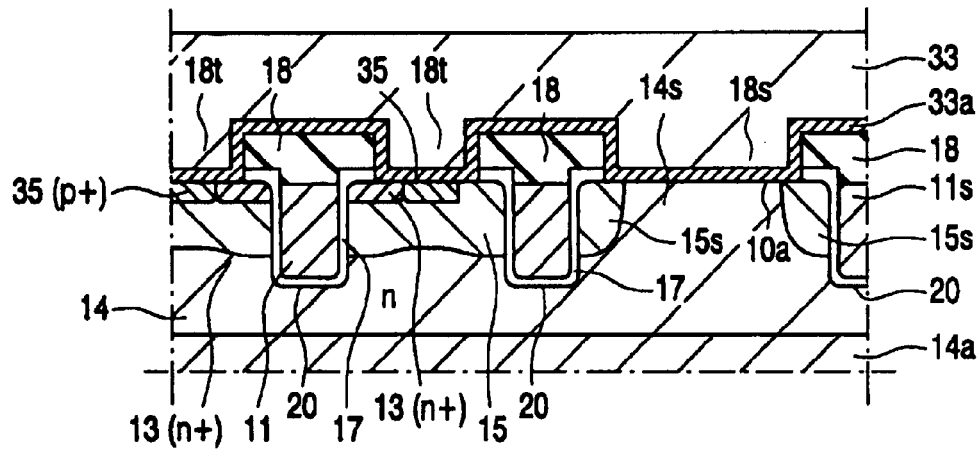

FIG. 9 illustrates the device structure after the masking pattern 51 is removed and an insulating overlayer 18 is provided over the trench-gate 11 and over the trench-electrode 11s. The insulating overlayer 18 may be provided by oxidation or deposition. In a specific example, the overlayer 18 may be about 0.3 μm thick. This overlayer 18 defines contact windows 18t for the transistor cells Ct and contact windows 18s for the Schottky cells Cs.

Then, dopant of the second conductivity type (i.e. p-type) may be introduced into the body 100 via the contact windows 18t so as to form a more highly doped contact region 35 for the channel-accommodating region 15. This is preferably achieved by implanting boron ions 65, as illustrated in FIG. 9. The resulting boron concentration is in-sufficient to over-dope the exposed source region 13 at the window 18t. Typically, this doping concentration may be, for example, about $10^{19}$ boron atoms $cm^{-3}$. This highly doped contact region 35 must be masked from the Schottky contact windows 18s where the Schottky barrier 80 is to be formed with the drain-region portion 14s. A mask 44 of, for example, photoresist may be used for this purpose. When (as above) the device is made with inactive intermediate cell parts, the alignment of the mask 44 with respect to the very narrow trench 20 of the insulated electrode 11s of the Schottky cell Cs is not critical.

FIG. 9 illustrates a thin oxide 50 being present at the contact windows 18t and 18s. This oxide layer 50 is removed by a short dip etch, so opening the windows 18t and 18s for contacting with the source electrode 33. The silicide layer 33a is then provided at least in the contact windows 18t and 18s. Layer 33a may be of titanium silicide or, for example, nickel silicide. The silicide material may itself be deposited, in which case the silicide layer 33a extends also over the insulating overlayer 18 between the contact windows. Alternatively, the silicide may be formed in situ by depositing a siliciding-forming metal layer 33a' which is heated to form the silicide at the silicon surface 10a in the windows 18t and 18s. In this latter case, the un-silicided parts of the metal layer 33a' on the insulating overlayer 18 may be subsequently etched away, or they may be left between the contact windows. In the transistor cells Ct, the silicide layer 33a forms a good low-resistance contact for the source electrode 33 to the highly-doped n-type source region 13 and p-type contact region 35. In the Schottky cells, the silicide layer 33a forms the silicide Schottky barrier 80 with the drain drift region portion 14s.

A metallurgical barrier layer of, for example, titanium-tungsten may then be deposited on the silicide layer 33a, before depositing a thick metal layer of aluminium or an aluminium-silicon alloy. Alternatively and/or additionally, the thick metal layer may be of, for example, copper so as to further reduce the source resistance. The metal layers have a layout pattern defined (by known photo-lithographic and etching techniques) into separate metallisation areas that form the source electrode 33 and also a gate bondpad that is connected to the trench-gate 11. The gate bondpad metallisation and its connection are outside the plane of the FIGS. 1 and 11 drawings. The back surface 10b of the wafer body 100 is then metallised to form the drain electrode 34, after which the wafer body 100 is divided into the individual device bodies 10.

It will be evident that many modifications and variations are possible within the scope of the present invention. Considerable flexibility is possible in the specific technologies that can be used, for example, in:

constructing the spacers 52, etching the narrow trenches 20, providing one or more insulators 17 on the trench bottom and sidewalls, providing the electrodes 11 and 11s in the trench 20, forming the guard region 15s and the channel-accommodating region 15, and the source region 13, and in the formation of other parts of the device.

Second Embodiment: Trench-Gate MOSFET Process (FIG. 12)

Figure 12:
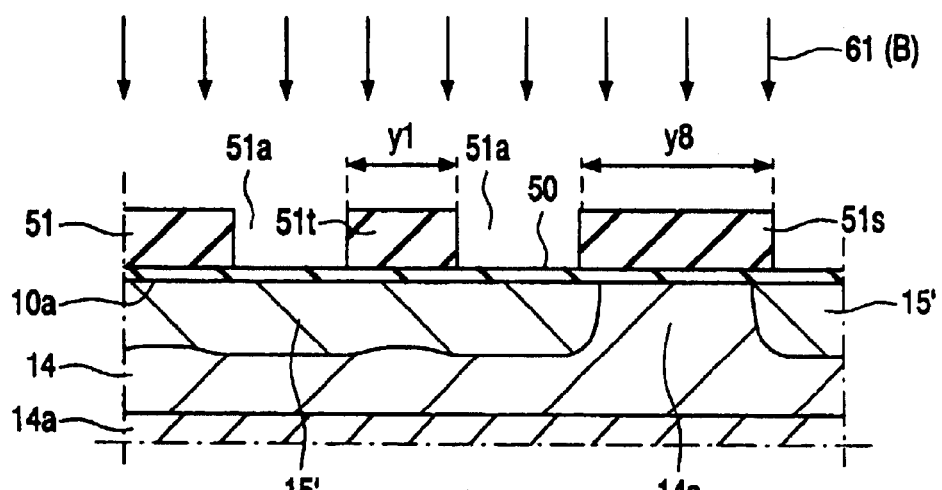
FIG. 12 is a cross-sectional view of the transistor-cell part and Schottky-cell part of FIG. 4 at a stage in its manufacture by a modification that is also in accordance with the invention.

By way of example, FIG. 12 illustrates one such modification in which the dopant introduction 61 of step (c) is carried out before providing the sidewall extensions 52 in step (b). Thus, the FIG. 12 implantation is carried out on the wafer structure at the stage illustrated in FIG. 4. The implanted boron now forms a continuous region 15' over the whole cellular area of the transistor cells Ct, but remains apertured where the drain-region portion 14s extends to the surface 10a below the mask part 51s of width y8.

The layer 52' is then deposited and etched back to form the spacers 52 as in FIG. 5. The trench 20 is then etched into the body 100 in step (b). This trench etch (and the subsequent provision of the insulated electrodes 11 and 11s) is similar that of FIG. 6, except that the trench 20 is etched through the region 15' (and hence though the channel-accommodating region 15 and guard region 15s) into the body portion 14 under the region 15'. The manufacture may then be continued as in FIGS. 8 to 11.

Third Embodiment: Rectifier Process (FIGS. 13 to 16)

Figure 16:
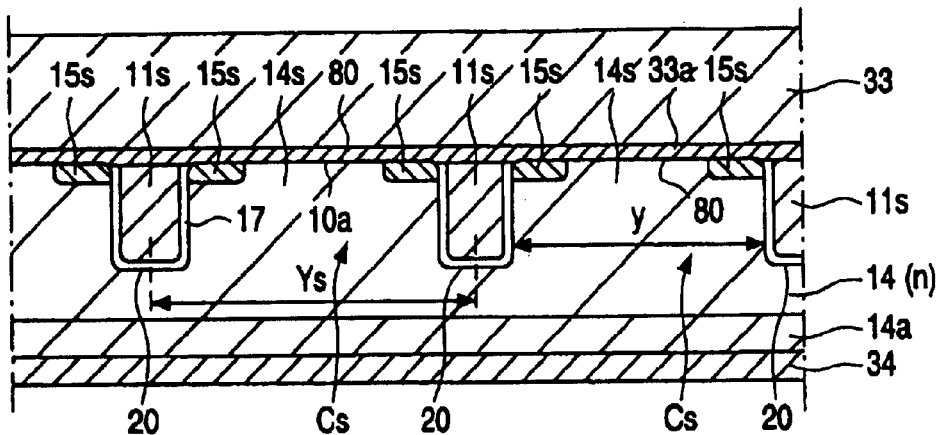

The present invention may also be used to form discrete cellular Schottky-rectifier devices, for example as modifications of the Schottky rectifier structures of U.S. Pat. No. 4,646,115 and U.S. Pat. No. 5,612,567. Such a device is illustrated in FIG. 16. In this case, the present invention permits the inclusion of a very compact guard ring 11s of the second conductivity type in a self-aligned manner, at the body surface 10a, adjacent to a narrow trenched insulated electrode 11s. Such a process is illustrated in this embodiment.

The cellular geometry of the Schottky cells Cs of the MOSFETs of FIGS. 1 to 12 is constrained by their integration into the cellular layout of the transistor cells Ct. However, in a discrete Schottky rectifier there is greater freedom in choosing the geometry and layout of the cells Cs. The characteristics of the Schottky rectifier can be adjusted by the geometry and width of the cells Cs and by varying the overall area of the Schottky barrier 80, as well as the barrier height. The cells Cs of FIG. 16 may be laid out in, for example, a close-packaged hexagonal cellular geometry.

Whichever particular cellular layout of individual Schottky-barrier areas is adopted for the Schottky barrier 80 and the guard region 15s, the guard region 15s preferably extends around the entire perimeter of each Schottky-barrier area so that the edge of the barrier 80 in each cell Cs terminates laterally in a guard ring 15s, i.e. as illustrated for cells Cs in FIG. 2. The drift-region portion 14s extends to the body surface 10a through the central aperture of this annular guard region 15s in each cell Cs.

Whichever particular cellular layout of individual Schottky-barrier areas is adopted, the cell pitch Ys is preferably chosen to be sufficiently narrow that the rectifier benefits from field-relief provided by the guard regions 15s and/or by the insulated trench electrode 11s in a manner similar to that described in, for example, U.S. Pat. No. 4,521,795. As compared with Schottky cells Cs in a MOSFET (such as FIGS. 1 and 2), more freedom is available in a discrete Schottky rectifier to vary the cell structure for optimum field relief. The pitch Ys can be very narrow, for example even sub-micron (less than 1 micrometer). The doping of the drift region 14 is so chosen (relative to the cell pitch Ys) as to be depleted over the whole mesa width y between neighbouring trenched insulated electrodes 11s in the blocking state. Indeed this depletion layer may extend with a substantially plane front to the higher doped electrode portion 14a before breakdown. This permits higher breakdown voltages to be achieved, for example 200V and higher.

This provision of field-relief for the Schottky barrier 80 permits (for a given blocking voltage) the doping concentration n of the drift region 14 to be higher than otherwise, so reducing the Vf. The Schottky-barrier leakage current can be reduced, or the barrier height for the same leakage can be lowered, so gaining an advantage in Vf. The doping concentration n of the drift region 14 may be substantially homogeneous, for example, about $2 \times 10^{16}$ or $3 \times 10^{16}$ phosphorus or arsenic atoms $cm^{-3}$. Alternatively, it may be graded, for example from less than $5 \times 10^{16}$ (e.g. $1 \times 10^{16}$) phosphorus or arsenic atoms $cm^{-3}$ at the surface 10a to more than 10 times greater (e.g. $3 \times 10^{17}$ phosphorus or arsenic atoms $cm^{-3}$) at the interface with substrate 14a, as disclosed in U.S. Pat. No. 5,612,567.

Regardless of how it is made, a Schottky rectifier having such features in combination is a novel device structure in its own right. Thus, according to another aspect of the present invention, a cellular Schottky-rectifier having a Schottky electrode 33 that forms a Schottky barrier 80 with a semiconductor body portion 14s of a first conductivity type (e.g. n-type) in a plurality of cells Cs, wherein:

each cell Cs is bounded laterally by a trenched insulated electrode 11s;

each cell Cs comprises a surface-adjacent guard region 15s of the opposite, second conductivity type (e.g. p-type) that terminates the edge of the Schottky barrier 80 in each cell, which guard region 15s extends around the perimeter of each cell Cs laterally adjacent to its trenched insulated electrode 11s;

the semiconductor body portion 14s forms a drift region 14 that adjoins the trenched insulated electrode 11s over most of the depth of its trench 20 and that has a width and doping concentration n sufficient for the drift region 14 to be depleted in a blocking state of the Schottky-rectifier;

and the trenched insulated electrode 11s is electrically connected to the Schottky electrode 33 to form a field-plate acting on the adjacent drift region 14 to deplete the drift region 14 in a blocking state of the Schottky-rectifier.

FIGS. 13 to 16 illustrate the manufacture of this rectifier by an embodiment of a method also in accordance with the invention.

Figure 6:
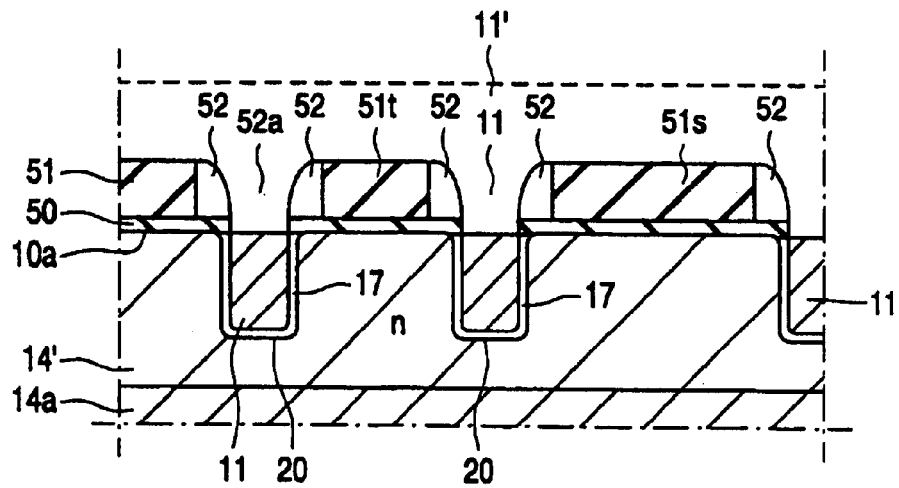
Figure 13:
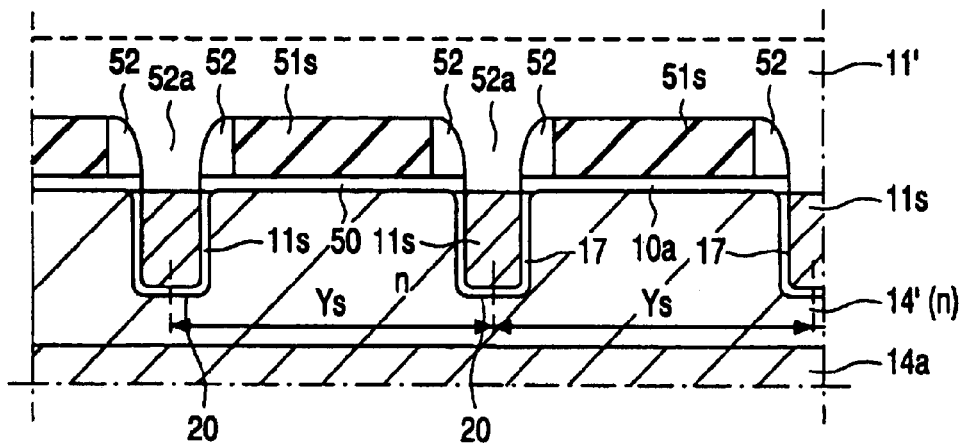
FIGS. 13 to 16 are cross-sectional views of an active central part of a trenched Schottky rectifier manufactured in accordance with the invention.

FIG. 13 illustrates the rectifier manufacture at a stage corresponding to FIG. 6 for the MOSFET manufacture. Thus, FIG. 13 shows the narrow window 52a defined by providing spacers 52 at the sidewalls of a wider window 51a of the mask pattern 51. It also shows the trenched insulated electrode 11s that is formed by etching trench 20 into the body 100 at the narrow window 52a and by providing insulating material 17 and then electrode material 11' in the trench 20. In this rectifier case, however, there are no narrow mask parts 51t (for MOSFET cells). Instead, all the cells are Schottky cells Cs defined by wide mask parts 51s.

Figure 14:
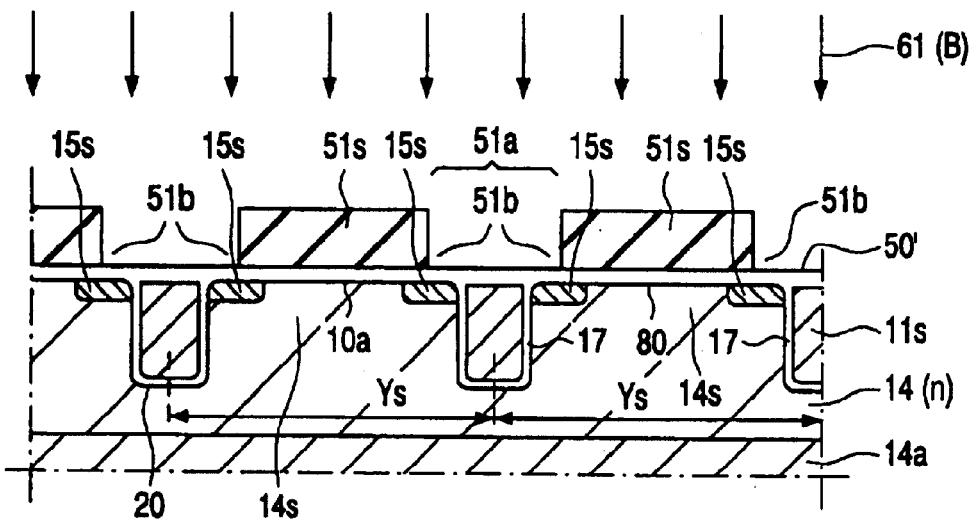
Figure 15:
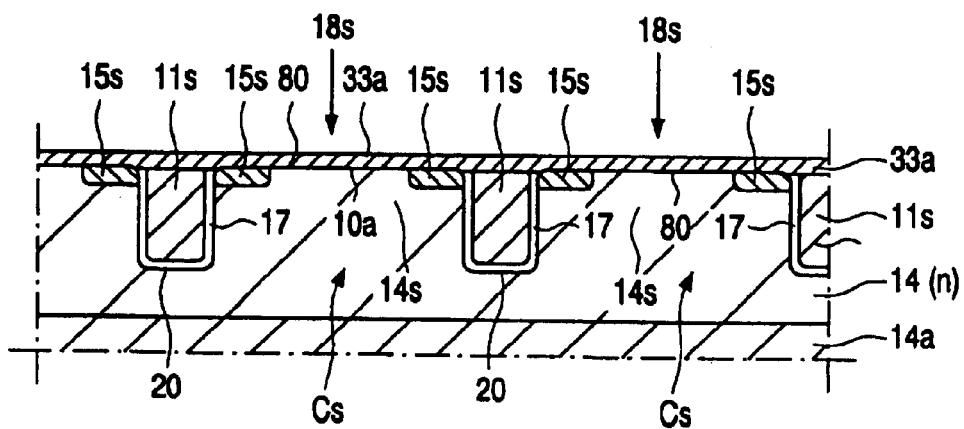

As illustrated in FIG. 14, the self-aligned narrow guard region 15s is provided by introducing dopant 61 of the second conductivity type (p-type in this example) into the body 100 via the wider window 51a of the mask pattern 51. This dopant introduction is preferably achieved by implanting boron ions 61 and then annealing the implant. Since no transistor cells Ct are being formed, this anneal may be of shorter duration and/or at a lower temperature so that less diffusion of the implanted dopant occurs. The mask pattern 51 is (as in FIGS. 7 and 12) sufficiently thick to mask the underlying body portion against the dopant introduction. The mask parts 51s are sufficiently wide (y8) to prevent the dopant from extending laterally into the area where the Schottky barrier 80 is to be formed.

Thereafter, the mask pattern 51 and layer 50 are removed, and the Schottky barrier 80 is formed by depositing, for example, a silicide or silicide-forming layer 33a and then the bulk of Schottky electrode 33. No insulating overlayer 18 is provided on the trench 20 of the rectifier. Instead, its trenched insulated electrode 11s is electrically contacted by the Schottky electrode 33. This trenched insulated electrode 11s acts as a field-plate on the portion 14s of the drift region 14 that adjoins the trench 20 over most of the depth of the trench 20. As described above, the width and doping concentration of this drift region 14 are sufficient for allowing it to be depleted in a blocking state of the Schottky-rectifier device.

The back surface 10b of the substrate 14a of the wafer body 100 is then metallised to form an ohmic electrode 34 (FIG. 16), after which the wafer body 100 is divided into the individual device bodies 10.

FIGS. 13 and 14 illustrate the trench 20 being etched before the dopant introduction for the guard region 15s. This follows the (MOSFET) sequence of FIGS. 4 to 7. However, the introduction of the dopant 61 may be effected before etching the trench 20, i.e. following the (MOSFET) sequence of FIGS. 4, 12, and then 6.

Further Embodiments: MOSFET or Rectifier Processes

Figure 17:
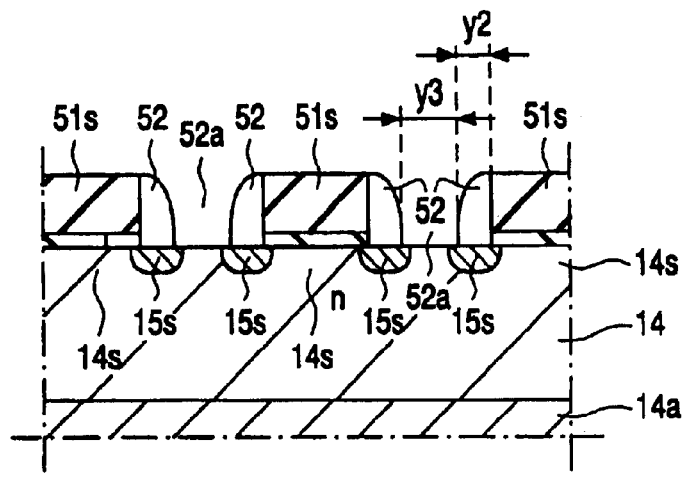
FIG. 17 is a cross-sectional view of a device part at a stage similar to that of FIG. 5 but with a modification in its manufacture that is also in accordance with the invention.

In the embodiments so far described, the guard region 15s is formed most conveniently by implanting dopant ions 61 at the wide window 51a, either before providing or after removing the spacers 52. However, the spacers 52 may be used in other ways to provide self-alignment of the guard region 15s with the trench 20. FIG. 17 illustrates one such alternative way, in which the guard region 15s is diffused into the body 100 from the spacers 52 themselves. The body 100 of FIG. 17 is at a stage similar to that of FIG. 5. However, in this case, the spacers 52 provided in step (b) contain the dopant of the second conductivity type (boron, for example), and this dopant is introduced into the body 100 by thermal diffusion in step (c). These spacers 52 of FIG. 17 may be of, for example, polycrystalline silicon.

In the embodiments described, the mask 51 and spacer 52 are each composed of a respective single material (silicon nitride or oxide), other embodiments are possible in which composite layers of different materials are used. Thus, for example, a thick composite mask 51 may be used at an early stage in the process, after which the mask 51 may be thinned by removal of an upper part. Even in the case when the original mask 51 is wholly of silicon nitride, oxy-nitride is formed at its surface when exposed to oxidising environments as the manufacturing process sequence progresses. Thus, for example, at the stage of FIGS. 6 and/or 9 and/or 13, the nitride mask 51 may include a skin of oxy-nitride that is etched away when the oxide spacers 52 and/or oxide material 18' are etched, so thinning the mask 51 at these stages.

Figure 18:
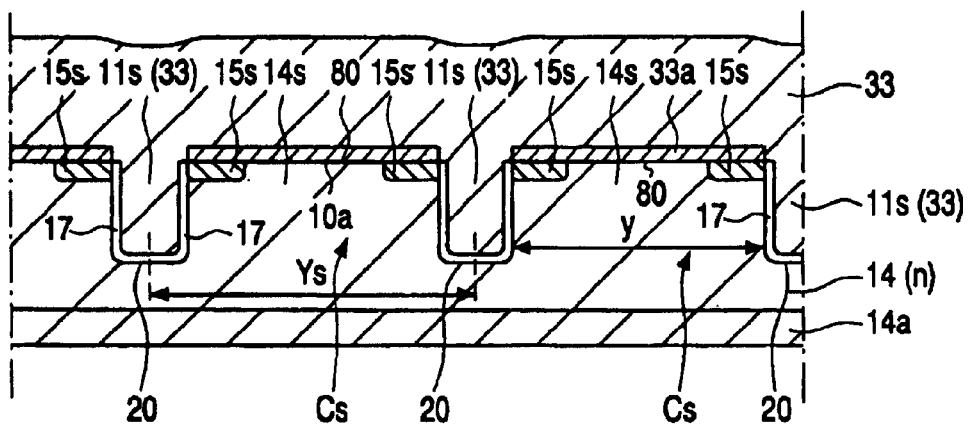
FIG. 18 is a cross-sectional view of an active central part of a trenched Schottky rectifier similar to FIG. 16, but manufactured by a modification that is also in accordance with the invention.

The trenched electrode 11, 11s may be formed of doped polycrystalline silicon as described above. However, other known gate technologies may be used in particular devices. Thus, for example, other materials may be used for the gate, such as a metal silicide. Alternatively, the whole gate 11 may be of a refractory metal instead of polycrystalline silicon. In the case of the Schottky rectifier of FIG. 16, the trenched electrode 11s may even be the same material as the electrode 33 and deposited in the same process step, after removing the masking pattern 51. Such a modification is illustrated in FIG. 18. Thus, for example, the following process sequence may be used for this rectifier:

dopant introduction for guard region 15s before etching the trench 20 (i.e. similar to FIG. 12), then etching the trench 20 and providing its insulator 17, then removing the masking pattern 51 and the spacers 52 (if still present), and then depositing the same electrode material for trenched electrode 11s and the main electrode 33.

In this last modification, the electrode provision part of step (b) of the present invention is carried out during step (d).

FIG. 1 illustrates a MOSFET device in which the guard regions 15s of the Schottky cells Cs have the same depth and doping concentration as the channel-accommodating region 15 of the transistor cells Ct. These regions 15s and 15 are formed in the same processing steps, as illustrated in FIGS. 7 and 12. However, it is also possible to use separate processing steps for the regions 15 and 15s, while still using spacers 52 for self alignment with the trench 20. Thus, for example, shallow guard rings 15s can be formed in the Schottky cells Cs in a manner similar to FIG. 14 or FIG. 17. The whole area of each Schottky cell Cs can be masked against a dopant implantation used to provide the deep channel-accommodating region 15 in the transistor cells Ct, for example in a modification of FIG. 7 or FIG. 12. In this manner, the respective depths and doping concentrations of the regions 15 and 15s can be optimised for their respective functions in relation to the depth of the trench 20 and the doping concentration of the drift region 14.

This masking of the area of the Schottky cells Cs can be done using a so-called "hard mask" of, for example, polycrystalline silicon or of another material that is able to withstand the device processing that is then carried out in the areas of the transistor cells Ct. The pattern of this hard mask may be similar to that of the photoresist masks 43 and 44 of FIGS. 8 and 9. Thus, for example, after forming shallow guard rings 15s at all the windows 51a, the oxide overlayers 18 may be formed in these windows 51a over all the trenches. The hard mask of polycrystalline silicon may then be provided over the area of the Schottky cells Cs, while keeping the nitride mask 51 in both the areas of Cs and Ct. Then the oxide overlayers 18 are etched away again from the windows 51a of the transistor cells, and the deep regions 15 and other transistor processing can be carried out to form the transistor cells Ct which have a new oxide overlayer 18 at their trenches. Thereafter, the hard mask of polycrystalline silicon is etched away, so that processing can be continued as in, for example, FIG. 10.

FIG. 2 illustrates the region 15s forming a guard ring around the whole perimeter of the Schottky barrier area in each cell Cs. However, as mentioned hereinbefore, the Schottky cells Cs may be of an elongate stripe geometry, and they may extend to the device termination area at the periphery of the body 10. Particularly but not exclusively in this case, the narrow ends of the elongate stripe cells Cs may terminate in a deeper, more highly doped termination region of the same conductivity type as regions 15s, whereas the guard regions 15s extend along the elongate sides of the cell Cs (between the trench 20 and the Schottky barrier 80). Such a cellular layout may be used for the Schottky cells of a MOSFET and/or a discrete Schottky rectifier.

FIG. 2 illustrates a cellular layout in which the Schottky trench 20 (and its electrode 11s) forms an integral, common network with the transistor trench 20 (and its gate electrode 11). However, these two trenches and their electrodes may be separated from each other in their layout, so permitting the electrode 11s to be biased separately from the transistor gate 11.

Instead of forming the drift region 14 by an epitaxial layer on a higher-doped substrate 14a, the higher doped region 14a of some devices may be formed by dopant diffusion into the back surface 10b of a high-resistivity substrate that provides the drift region 14. The devices described with respect to FIGS. 1 to 12 are MOSFETs in which the higher-doped substrate 14a or region 14a is of the same conductivity type (n-type in this example) as the drain drift region 14. However, the higher-doped substrate 14a or region 14a may be of opposite conductivity type (p-type in this example) to provide an IGBT. The electrode 34 is called an anode electrode in the case of an IGBT.

Vertical discrete devices have been illustrated with reference to FIGS. 1 and 16, having their second main electrode 34 contacting the substrate or other region 14a at the back surface 10b of the body 10. However, an integrated device is also possible in accordance with the invention. In this case, the region 14a may be a doped buried layer between a device substrate and the epitaxial low-doped drift region 14. This buried layer region 14a may be contacted by an electrode 34 at the front major surface 10a, via a doped peripheral contact region which extends from the surface 10a to the depth of the buried layer.

The particular MOSFET examples described above are n-channel devices, in which the regions 13 and 14 are of n-type conductivity, the regions 15, 15s and 35 are of p-type, and an electron inversion channel 12 is induced in the region 15 by the gate 11. By using opposite conductivity type dopants, a p-channel device with integrated can be manufactured by a method in accordance with the invention. In this case, the regions 13 and 14 are of p-type conductivity, the regions 15, 15s and 35 are of n-type, and a hole inversion channel 12 is induced in the region 15 by the gate 11. Similarly, a Schottky rectifier may be manufactured, in which the Schottky electrode 33 forms the Schottky barrier with a p-type body portion 14s.

Semiconductor materials other than silicon may be used for devices in accordance with the invention, for example silicon carbide.

From reading the present disclosure, other variations and modifications will be apparent to persons skilled in the art. Such variations and modifications may involve equivalent and other features which are already known in the art (for example, U.S. Pat. Nos. 4,521,795, 4,646,115 and 5,612,567) and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

The Applicants hereby give notice that new Claims may be formulated to any such features and/or combinations of such features during the prosecution of the present Application or of any further Application derived therefrom.

What is claimed is:

1. A method of manufacturing a semiconductor device having a Schottky barrier between a Schottky electrode and a semiconductor body portion of a first conductivity type that is bounded laterally by a trenched insulated electrode, the Schottky barrier terminating laterally in a guard region of the opposite, second conductivity type adjacent to the trenched insulated electrode, wherein the following process steps are used to self-align the guard region, the trenched insulated electrode and the Schottky barrier with respect to each other:
   (a) a mask pattern is provided at a surface of a semiconductor body to mask an area where the Schottky barrier is to be formed,
   (b) a narrow window is defined by providing sidewall extensions at the sidewalls of a wider window of the mask pattern, and the trenched insulated electrode is formed by etching a trench into the body at the narrow window and by providing insulating material and then electrode material in the trench,
   (c) the guard region is provided by introducing dopant of the second conductivity type into the body via the wider window of the mask pattern, the mask pattern being sufficiently thick to mask the underlying body portion against the dopant introduction and sufficiently wide to prevent the dopant from extending laterally into the area where the Schottky barrier is to be formed, and
   (d) at least the mask pattern is removed before depositing the Schottky electrode at least at the area where the Schottky barrier is to be formed.

2. A method according to claim 1, wherein the dopant introduction of step (c) is carried out before providing the sidewall extensions in step (b), and the trench is etched in step (b) through the guard region and into the body portion under the guard region.

3. A method according to claim 1, wherein the dopant introduction of step (c) is carried out after providing the trenched insulated electrode in step (b).

4. A method according to claim 3, wherein the dopant introduction of step (c) is carried out after removing the sidewall extensions to form a doping window between the masking pattern and the trenched insulated electrode, the dopant being introduced into the body at the doping window in step (c).

5. A method according to claim 4, wherein the dopant is introduced into the body by dopant ion implantation at the doping window.

6. A method according to claim 1, wherein the sidewall extensions provided in step (b) contain the dopant of the second conductivity type that is introduced into the body by thermal diffusion in step (c).

7. A method according to claim 6, wherein the device comprises a cellular trench-gate field-effect transistor device having source and drain regions of the first conductivity type separated by a channel-accommodating region of the second conductivity type, wherein:
   the trench-gate is formed in step (b) as a trenched insulated electrode that is insulated from the Schottky electrode,
   the semiconductor body portion of the first conductivity type provides a drain drift region of the transistor device,
   the source region is provided so as to be self-aligned with the trench-gate by means of the sidewall extensions, and
   the Schottky electrode is provided as part of a source electrode that contacts the source region.

8. A method according to claim 7, wherein, the cellular device comprises at least one Schottky cell in which the Schottky barrier is formed with the drain drift region, and a plurality of transistor cells without the Schottky barrier.

9. A method according to claim 7, wherein the channel-accommodating region of the transistor device is formed at the same time as the guard region of the Schottky device, by the dopant introduction of step (c).

10. A method according to claim 9, wherein the cellular transistor device comprises a plurality of transistor cells without the Schottky barrier, and the said mask pattern is narrower over the transistor cells than over the area where the Schottky barrier is formed, and the dopant introduced into the transistor cells in step (c) is laterally merged into a channel-accommodating region that extends under the mask pattern in the transistor cells so as to separate the drain drift region from the body surface in the transistor cells.

11. A method according to claim 8, wherein additional dopant of the second conductivity type is introduced into the transistor cells to form a more highly doped contact region for the channel-accommodating region of these transistor cells, while being masked from the at least one Schottky cell where the drain drift region extends to the body surface to form the Schottky barrier.

12. A method according to claim 7, wherein the body comprises silicon adjacent to the said surface, and a metal-silicide layer is provided as a lower layer of the source electrode so as to form a silicide Schottky barrier with the drain drift region and a silicide low-ohmic contact to the source region.

13. A method according to claim 1, wherein the device comprises a cellular Schottky-rectifier device having its trenched insulated electrode electrically connected to the Schottky electrode, and the said semiconductor body portion forms a drift region that adjoins the trench over most of the depth of the trench and that has a width and doping concentration sufficient for the drift region to be depleted in a blocking state of the Schottky-rectifier device.

14. A method according to claim 13, wherein a cellular layout of individual Schottky-barrier areas is adopted for the Schottky barrier and the guard region, and the guard region extends around the entire perimeter of each Schottky-barrier area.

15. A method according to claim 14, wherein the mask pattern comprises a thick layer of silicon nitride on a thin layer of silicon dioxide on the semiconductor body surface, and wherein the sidewall extensions are of silicon dioxide.

* * * * *